(12) United States Patent
Saitou

(10) Patent No.: US 6,235,982 B1
(45) Date of Patent: May 22, 2001

(54) PHOTOELECTRIC CONVERSION APPARATUS AND METHOD FOR MANUFACTURING THE SAME

(75) Inventor: Sugao Saitou, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/384,618

(22) Filed: Aug. 27, 1999

(30) Foreign Application Priority Data

Aug. 27, 1998 (JP) .................................................. 10-241315

(51) Int. Cl.⁷ .................................................. H01L 31/05
(52) U.S. Cl. ..................... 136/244; 136/256; 136/258; 438/80; 438/96; 438/98; 257/443; 257/448
(58) Field of Search .................... 136/244, 256, 136/258 AM; 438/80, 96, 98; 257/443, 448

(56) References Cited

U.S. PATENT DOCUMENTS 5,421,908 * 6/1995 Yoshida et al. ..................... 136/244

FOREIGN PATENT DOCUMENTS

| 6-342924 | 12/1994 | (JP) . |
| 7-307481 | * 11/1995 | (JP) . |
| 7-321355 | * 12/1995 | (JP) . |
| 8-340125 | * 12/1996 | (JP) . |
| 2647892 | 8/1997 | (JP) . |
| 10-233522 | * 9/1998 | (JP) . |
| 11-177108 | * 7/1999 | (JP) . |

* cited by examiner

Primary Examiner—Alan Diamond
(74) Attorney, Agent, or Firm—Rossi & Associates

(57) ABSTRACT

A photoelectric conversion apparatus is provided which includes a substrate at least a surface of which has an insulating property, a plurality of unit photoelectric conversion elements each comprising at least a lower electrode, a photoelectric conversion layer, and an upper electrode that are formed in this order on the front surface of the substrate, and a plurality of rear electrodes formed on the rear surface of the substrate. In this apparatus, the lower electrode and upper electrode of each unit photoelectric conversion element are connected to a corresponding one of the rear electrodes through an aperture formed through the substrate, such that the unit photoelectric conversion elements are connected in series. Each of the rear electrodes comprises a first connecting electrode and a second connecting electrode. Also, a first connection part of the lower electrode of each unit photoelectric conversion element with the first connecting electrode of the corresponding rear electrodes, and a second connection part of the upper electrode with the second connecting electrode are both located on an inner wall of the aperture formed through the substrate.

16 Claims, 7 Drawing Sheets

PHOTOELECTRIC CONVERSION APPARATUS AND METHOD FOR MANUFACTURING THE SAME

FIELD OF THE INVENTION

The present invention relates to a photoelectric conversion apparatus including a substrate and a plurality of unit photoelectric conversion elements formed on the substrate and connected in series, and also relates to a method for manufacturing such a photoelectric conversion apparatus.

BACKGROUND OF THE INVENTION

SCAF (Series Connection through Apertures on Film) type photoelectric conversion apparatus is known as a typical example of photoelectric conversion apparatus in which a plurality of unit photoelectric conversion elements formed on the same substrate are connected in series.

In the SCAF type photoelectric conversion apparatus, a plurality of unit photoelectric conversion elements are formed on, for example, a flexible substrate having an insulating property, such that each of the unit photoelectric conversion elements is composed of a lower electrode, a photoelectric conversion layer consisting of a thin-film semiconductor layer, and an upper electrode, which are laminated in this order on the substrate. By electrically connecting the lower electrode of a certain unit photoelectric conversion element with the upper electrode of its adjacent unit photoelectric conversion element in a repeated manner, namely, by connecting the plural unit photoelectric conversion elements in series, a desired voltage may be established between the lower electrode of the first unit photoelectric conversion element and the upper electrode of the last unit photoelectric conversion element. In order to provide an alternating voltage of 100V as a commercial power source as a result of dc/ac conversion by an inverter, for example, the photoelectric conversion apparatus is desired to produce an output voltage of 100V or higher, and, in an actual apparatus, several tens of unit photoelectric conversion elements are connected in series.

The series connection of the unit photoelectric conversion elements is established by forming electrode layers and photoelectric conversion layer and patterning each of these layers, through a suitable combination of film-forming and patterning processes. A known example of photoelectric conversion apparatus will be now described in which a small number of unit photoelectric conversion elements are connected in series.

FIG. 7(a) is a plan view showing a conventional thin-film solar cell including series-connected electrodes formed on opposite surfaces of a substrate, and FIG. 7(b) is a cross-sectional view taken along lines x–X of FIG. 7(b). In FIG. 7(b), "n" is suffixed to reference numerals that denote adjacent unit photoelectric conversion element and adjacent electrodes.

A large number of unit photoelectric conversion elements are formed on one surface (that will be called "front surface") of a substrate 1 formed of a flexible insulating material, such that each if unit photoelectric conversion element is composed of a lower electrode layer, photoelectric conversion layer and an upper electrode layer that are laminated on each other. On the other surface (rear surface) of the substrate is formed a rear electrode consisting of a first connecting electrode layer and a second connecting electrode layer that are laminated on each other.

Initially, a lower electrode layer is formed on one surface of the substrate 1 through which connecting holes or apertures H1 are formed, and a rear electrode layer is formed on the other surface of the substrate 1. The lower electrode layer and the first connecting electrode layer overlap each other on the inner wall of each connection hole H1, so that these layers are electrically connected with each other. The lower electrode layer is subjected to laser beam machining for removing thin strip-like parts of the electrode layer to provide parting lines L1, so that the lower electrode layer is divided by the parting lines L1 into individual lower electrodes 2e having a desired shape. Then, current collecting holes or apertures H2 are formed through the substrate, lower electrode layer and the first connecting electrode layer. Subsequently, a photoelectric conversion layer is formed over the entire area of the substrate made of a-Si. With the opposite end portions of the substrate being covered by masks having a simple shape (e.g., rectangular shape), an upper electrode layer as a transparent electrode layer is formed on the substrate, using the above masks, so that the electrode layer does not extend over the connection holes H1. Then, a second connecting electrode layer is formed on the entire area of the rear surface of the substrate, such that the upper electrode layer and the second connecting electrode layer overlap each other on the inner wall of the current collecting holes H2, so that these layers are electrically connected with each other. Subsequently, the upper electrode layer and a laminate of the first and second connecting electrodes are subjected to laser beam machining so that the upper electrode layer is divided by parting lines L2 into individual upper electrodes 5e, and the first and second connecting electrode layer are divided by parting lines L3 into individual first and second connecting electrodes 3e, 6e.

As a result of the process as described above, the unit photoelectric conversion elements are connected in series such that current flows through the second connecting electrode 6e and first connecting electrode 3e on the rear side of the substrate, lower electrode 2e, photoelectric conversion layer 4p, and upper electrode 5e (namely, one unit photoelectric conversion element), current collecting hole H2, adjacent second connecting electrode 6en and first connecting electrode 3en, connecting hole H1 lower electrode 2en, photoelectric conversion layer 4pn and upper electrode 5en (namely, adjacent unit photoelectric conversion element), in the order of description.

In the known SCAF type photoelectric conversion apparatus as described above, the total area of the connecting holes and collecting holes that are non-power-generating regions can be made considerably smaller than the area of the unit photoelectric conversion elements and the area of the substrate, and therefore the ratio of the non-power-generating area to the overall substrate area, namely, area loss, can be considerably reduced. Also, the electrodes at the opposite ends of the series-connected unit photoelectric conversion elements, namely, external lead electrodes between which the output voltage is established, are located on the rear surface of the substrate, and thus do not provide non-power-generating regions, which greatly contributes to a reduction in the area loss. Furthermore, external leads are connected to the external lead electrodes on the rear surface, thus avoiding an increase in the non-power-generating region.

Another known example of photoelectric conversion apparatus similarly intended for a reduction in the area loss is disclosed in Japanese Patent No. 2,647,892. In this photoelectric conversion apparatus, a second rear electrode film, insulating film, first rear electrode film, semiconductor film and a light-receiving side electrode film are laminated in this order on a substrate. The electrical connection between the light-receiving side electrode film and the second rear electrode film is established through a contact hole formed through the insulating film, first rear electrode film and the semiconductor film, and electrical connection between the first rear electrode film and second rear electrode film is established through another contact hole formed through the insulating film, so that the unit photoelectric conversion elements are connected in series. In this photoelectric conversion apparatus, the second rear electrode film and the unit photoelectric conversion elements are disposed on the same surface of the substrate. Since the second rear electrode film provides output electrodes for connection with leads at the opposite ends of the series-connected unit photoelectric conversion elements, external leads must be connected to the output electrodes on the side of the light-receiving surface, and therefore the area loss cannot be sufficiently reduced. In the above-described SCAF type photoelectric conversion apparatus, on the other hand, the upper and lower electrodes of the unit photoelectric conversion elements are connected to the corresponding connecting electrodes or rear electrodes formed on the rear surface opposite to the light-receiving surface of the substrate, through apertures formed through the substrate. Thus, the output electrodes are located on the rear surface of the substrate, thus making it possible to connect external leads with these electrodes without increasing an area loss.

In the known photoelectric conversion apparatus, however, the connecting holes H1 need to be located outside the power-generating region (generally, in the peripheral portion of the substrate), and therefore the upper electrodes 5e are not formed on the opposite end portions of the substrate including the connecting holes H1, which provides non-power-generation regions R. Thus, area loss due to non-power-generating regions is not sufficiently reduced. Substantially no problem arises in principle where masks are formed over individual connecting holes H1 so as not to form the upper electrode layer in and around the connecting holes H1. However, in the case of a large-length substrate, in particular, the above manufacturing process tends to be complicated, resulting in a significant increase in the manufacturing cost, and is thus not employed.

While laser beam machining is employed for patterning each electrode in the manufacture of the known photoelectric conversion apparatus, there is a need to pattern only the electrodes located on one surface of the substrate. In order to avoid any damage of thin film(s) on the opposite surface of the substrate due to a laser beam transmitted through the substrate, it is required to select the material of the substrate from those having a low transmittance to laser beams, or select an appropriate type of laser beam, or control its power. For the same reason, there is a limit to the construction or shape of electrodes films.

SUMMARY OF THE INVENTION

It is therefore an object of the present invention to provide a photoelectric conversion apparatus wherein a large number of unit photoelectric conversion elements are connected in series, which apparatus can be easily manufactured and assures reduced area loss. It is another object of the invention to provide a method for manufacturing such a photoelectric conversion apparatus.

To accomplish the above object, the present invention provides a photoelectric conversion apparatus which comprises: a substrate at least a surface of which has an insulating property; a plurality of unit photoelectric conversion elements each comprising at least three layers of a lower electrode, a photoelectric conversion layer, and an upper electrode that are formed on a first surface of the substrate in an order of description; and a plurality of rear electrodes formed on a second surface of the substrate, wherein the lower electrode and upper electrode of each unit photoelectric conversion element are connected to a corresponding one of the rear electrodes through an aperture formed through the substrate, such that the unit photoelectric conversion elements are connected in series, wherein each of the rear electrodes comprises a first connecting electrode and a second connecting electrode, and wherein a first connection part of the lower electrode of each unit photoelectric conversion element with the first connecting electrode of the corresponding rear electrode, and a second connection part of the upper electrode of each unit photoelectric conversion element with the second connecting electrode of the corresponding rear electrode are both located on an inner wall of the aperture formed through the substrate.

In one preferred form of the invention, an insulating layer is interposed between the first connection part of the lower electrode with the first connecting electrode and the second connecting part of the upper electrode with the second connecting electrode, such that both of the first and second connection parts are insulated from each other by the insulating layer.

In another preferred form of the invention, an insulating layer is interposed between the first connecting electrode and the second electrode corresponding to each of the unit photoelectric conversion elements, such that the first and second connecting electrodes are insulated from each other by the insulating layer.

In the above form of the invention, the first connecting electrode corresponding to each of the unit photoelectric conversion elements is preferably connected with the second connecting electrode corresponding to an adjacent one of the unit photoelectric conversion elements within a removed portion or aperture formed through the insulating layer.

The insulating layer may be preferably formed of silicon oxide or silicon nitride.

The insulating layer may also be preferably formed of heat-resistant resin selected from the group consisting of polyimide, aramid and tetrafluoroethylene.

The substrate may be composed of a conductive substrate and a substrate insulating layer that covers a surface of the conductive substrate, such that at least the inner wall of the aperture is covered by the substrate insulating layer, and the first and second connection parts are insulated from the substrate.

The substrate insulating layer may be formed of silicon oxide or silicon nitride.

The substrate insulating layer may also be formed of heat-resistant resin selected from the group consisting of polyimide, aramid and tetrafluoroethylene.

According to another aspect of the present invention, there is provided a method for manufacturing the photoelectric conversion apparatus as described above, wherein a single film or a laminated film comprising at least one of the lower electrode, photoelectric conversion layer, upper electrode, first connecting electrode, second connecting electrode and, if any, insulating layer, is partially removed by forming a lift-off mask having a shape to be removed, then forming the single film or laminated film to be partially removed over the lift-off mask, and then peeling off the lift-off mask while removing a part of the single film or laminated film that is located on the lift-off mask.

In the method as described above, the lift-off mask is preferably formed of polyimide resin. Also, the lift-off mask is preferably formed by screen printing.

In the method for manufacturing a photoelectric conversion apparatus as described above, the first connecting electrode layer and the second connecting electrode layer with the insulating layer interposed therebetween are preferably electrically connected to each other by forming an opening through the insulating layer, and melting the first and second connecting electrode layers so as to fill the opening.

According to the present invention, electrical connection between the lower electrode and the first connecting electrode and electrical connection between the upper electrode and the second connecting electrode are both established in one type of common connecting hole such that these connecting parts are insulated from each other by an insulating layer interposed therebetween. Also, double-layer connecting electrodes are formed on the rear surface of the substrate opposite to the light-receiving surface, and an insulating layer is interposed between these connecting electrode layers, so as to permit isolation and connection between a connecting electrode of one unit photoelectric conversion element and a corresponding connecting electrode of an adjacent unit photoelectric conversion element. Thus, series connection of the unit photoelectric conversion elements can be accomplished only on the rear surface of the substrate. Accordingly, the conventional connecting holes need not be provided, and the limit to the location of the upper electrode layer due to the provision of the connecting holes is eliminated, namely, non-power generating regions are not produced, which leads to a significant reduction in area loss.

Also, in the method of the present invention as described above, the electrode layers and/or photoelectric conversion layer are divided into individual connecting electrodes and unit photoelectric conversion elements, by peeling off a lift-off mask so as to remove a part of the relevant layer located on the mask. This process is not influenced by deformation of the substrate due to a high-temperature film-forming process, or the like, and highly accurate positioning required for laser beam machining is not needed, resulting in a simplified method for manufacturing photoelectric conversion apparatuses. This feature is particularly advantageous where the substrate is formed of resin that tends to undergo thermal deformation, for example, and makes it easy to produce a large-length photoelectric conversion apparatus.

BRIEF DESCRIPTION OF THE DRAWINGS

The invention will be described in greater detail with reference to certain preferred embodiments thereof and the accompanying drawings, wherein.

DETAILED DESCRIPTION OF THE PREFERRED EMBODIMENTS

First Embodiment

Figure 1A:
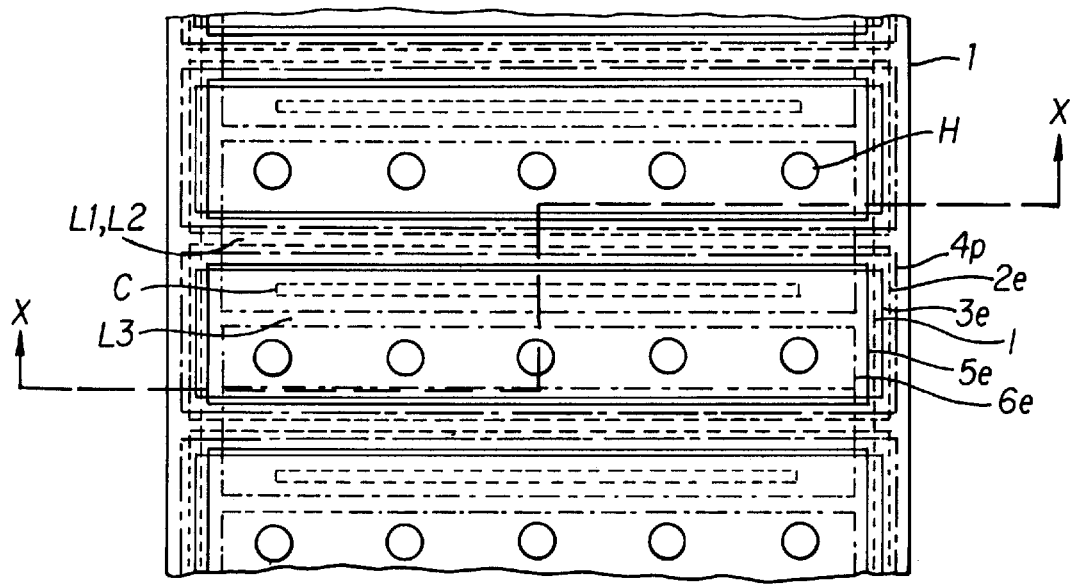
FIG. 1(a) is a plan view showing a photoelectric conversion apparatus having common connection holes, as one preferred embodiment of the present invention.
Figure 1B:
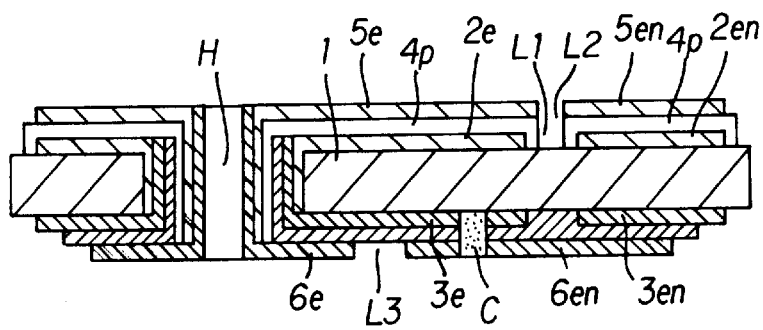
FIG. 1(b) is a cross-sectional view taken along lines x–X of FIG. 1(a)
Figure 2A:
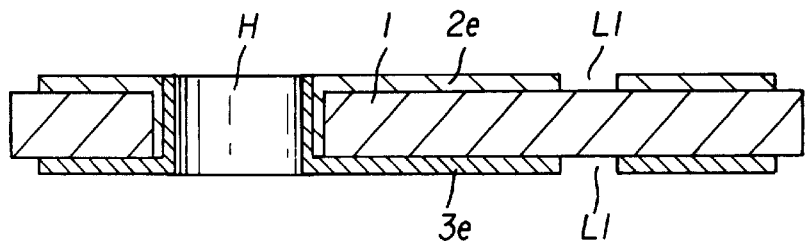
FIGS. 2(a)–2(e) are views showing respective process steps for fabricating the photoelectric conversion apparatus of the embodiment of FIGS. 1(a) and 1(b)
Figure 2B:
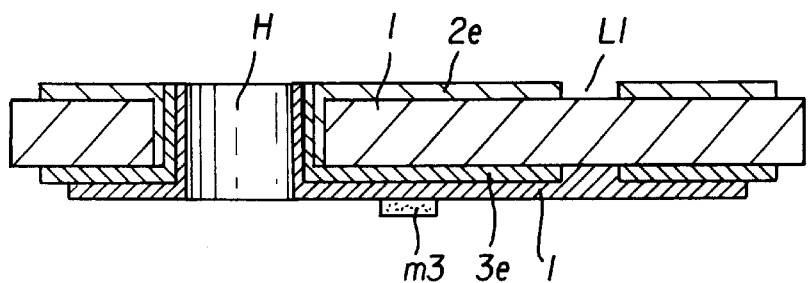
Figure 2C:
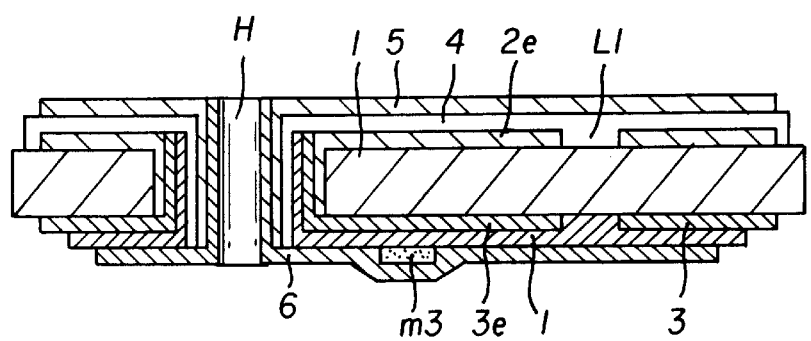
Figure 2D:
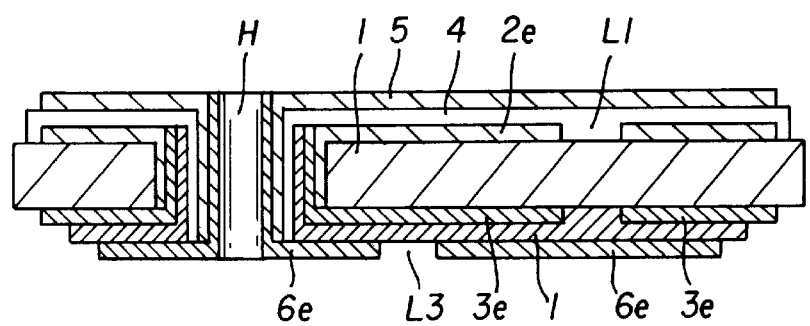
Figure 2E:
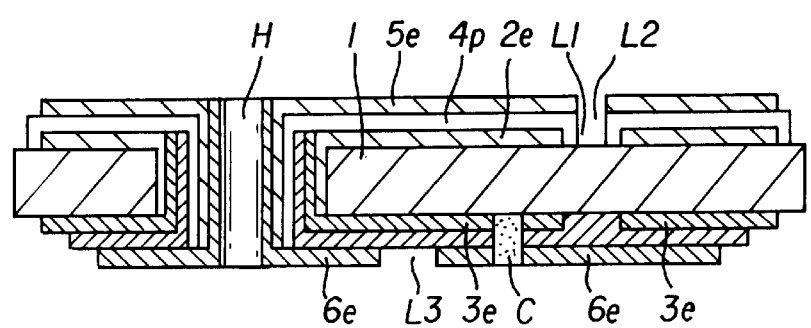

FIG. 1(a) is a plan view showing one preferred embodiment of a photoelectric conversion apparatus including common connection holes according to the present invention, and FIG. 1(b) is a cross-sectional view taken along line x–X of FIG. 1(a). FIGS. 2(a) through 2(e) show process steps for fabricating the photoelectric conversion apparatus of the present embodiment, wherein FIG. 2(a) shows the state in which a first connecting electrode layer has been formed, FIG. 2(b) shows the state in which a mask for forming a parting line has been formed, FIG. 2(c) shows the state in which a second connecting electrode layer has been formed, FIG. 2(d) shows the state in which second connecting electrodes have been formed, and FIG. 2(e) shows the state in which connecting electrodes have been connected to each other. In FIG. 1(b), "n" is suffixed to reference numerals that denote adjacent unit photoelectric conversion element and adjacent electrodes.

The photoelectric conversion apparatus of the present embodiment of FIG. 1 is fabricated according the manufacturing process having the steps of FIG. 2(a) through FIG. 2(e).

Initially, 1mm-diameter apertures (common connection holes H) are formed using a punch, through a 0.5 mm-thickness elongate substrate 1 having an insulating surface and formed of aramid resin. Thereafter, a laminate of silver and zinc oxide layers is successively formed on the substrate by sputtering in the longitudinal direction of the substrate, so as to form a lower electrode layer on one major surface of the substrate 1 and then form a first connecting electrode layer on the other surface.

Subsequently, thin, parting lines L1 are formed at the same time in the lower electrode layer and the first connecting electrode layer on the opposite surfaces of the substrate, using a second harmonic wave (having a wavelength of 0.53 μm) of a YAG:Nd laser, which wave can transmit through the aramid substrate. With the parting lines L1 thus formed, the lower electrode layer and first connecting electrode layer are divided into individual lower electrodes 2e and first connecting electrodes 3e, respectively. On the inner wall of each common connection hole H, the lower electrode layer and first connecting electrode layer are superposed on each other so that these layers are electrically connected with each other, as shown in FIG. 2(a).

After the step of FIG. 2(a), an insulating layer I made of silicon dioxide is formed on the rear surface of the substrate 1 by sputtering, such that the inner face of the aperture H is also covered with the insulating layer I. As shown in FIG. 2(b), a strip-like lift-off mask m3 is formed on the insulating layer I by screen printing, using polyimide resin having a smaller difference in the coefficient of thermal expansion as compared with that of the substrate 1.

In the next step of FIG. 2(c), a photoelectric conversion layer 4 made of a-Si is formed by plasma CVD on the front surface of the substrate 1, and an upper electrode layer 5 as a transparent electrode layer made of indium oxide is then formed by sputtering on the photoelectric conversion layer 4. In addition, a second connecting electrode layer 6 made of silver is formed on the rear surface of the substrate 1. On the inner wall of the common connecting hole H, the upper electrode layer 5 and second connecting electrode layer 6 are superposed on each other on the insulating layer I so that these layers 5, 6 are electrically connected with each other.

Thereafter, the lift-off mask m3 is peeled off so as to remove a part of the second connecting electrode layer 6 located on the mask m3, and thereby form a parting line L3, so that the second connecting electrode layer 6 is divided into individual second connecting electrodes 6e. Then, corresponding parts of the upper electrode layer 5 and photoelectric transfer layer 4 are removed by laser beam machining, so as to provide individual upper electrodes 4e, as shown in FIG. 2(d). What is important in the laser beam machining performed on the upper electrode layer 5 is that the thickness of the second connecting electrode layer 6 should be large enough to prevent the connecting electrode layer 6 from being removed and cut off by a transmitted laser beam during laser beam machining of the upper electrode layer 5. In the present embodiment, the thickness of the second connecting electrode layer 6 is controlled to be about 0.2 $\mu$m, thus avoiding removal and cut-off of the first connecting electrode 3.

In the final step of FIG. 2(e), a laser beam is incident upon the second connecting electrode 6e so as to break the insulating layer I and form a removed portion C of the insulating layer, and at the same time melt the second connecting electrode 6e and first connecting electrode 3e, so that these connecting electrodes are electrically connected to each other.

In the manner as described above, unit photoelectric conversion elements are connected in series, utilizing only one type of common connection holes. It is to be noted that the cross-sectional view of FIG. 1(b) is identical with that of FIG. 2(e).

The photoelectric conversion apparatus fabricated in the above manner according to the present invention does not suffer from area loss due to connection holes and non-power-generating regions surrounding the holes as provided in conventional photoelectric conversion apparatuses. Further, thin films on the opposite surfaces of the substrate are subjected to laser beam machining at the same time with the same pattern, which makes it possible to employ a substrate having a high transmittance of laser beams though it was conventionally difficult to use such a substrate.

Second Embodiment

Figure 3A:
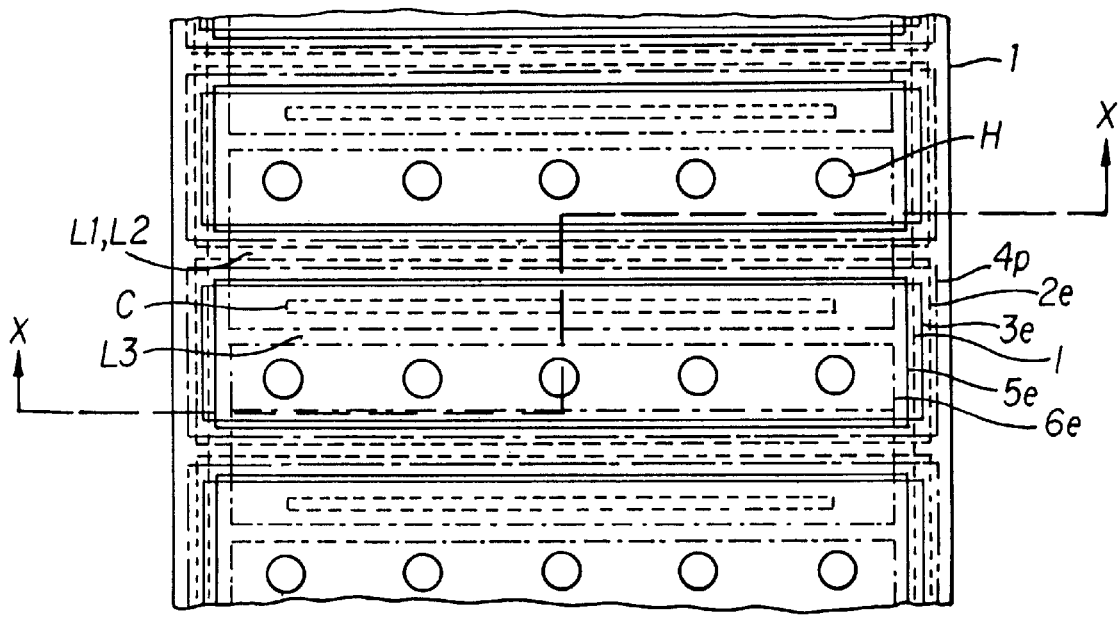
FIG. 3(a) is a plan view showing a photoelectric conversion apparatus having common connection holes, as another preferred embodiment of the present invention.
Figure 3B:
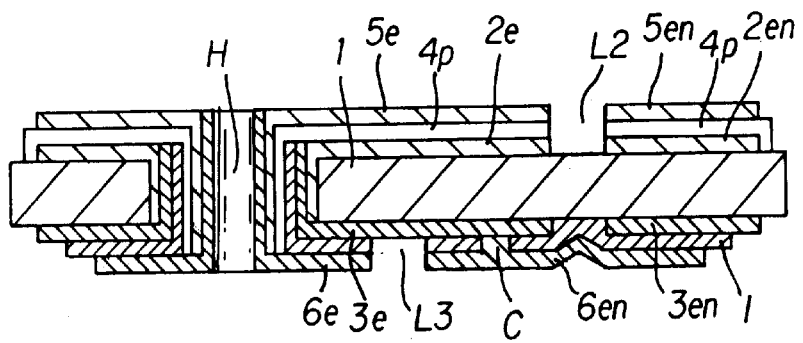
FIG. 3(b) is a cross-sectional view taken along lines x–X of FIG. 3(a)
Figure 4A:
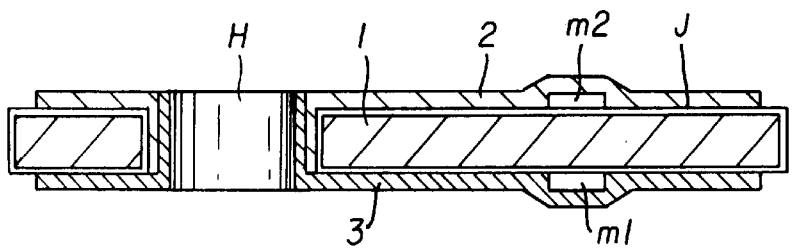
FIGS. 4(a)–4(e) are views showing respective process steps for fabricating the photoelectric conversion apparatus of the embodiment of FIGS. 3(a) and 3(b)
Figure 4B:
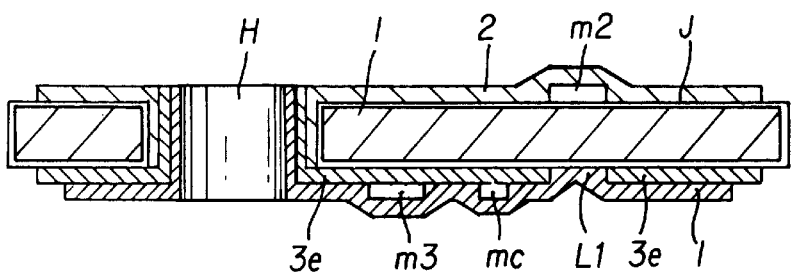
Figure 4C:
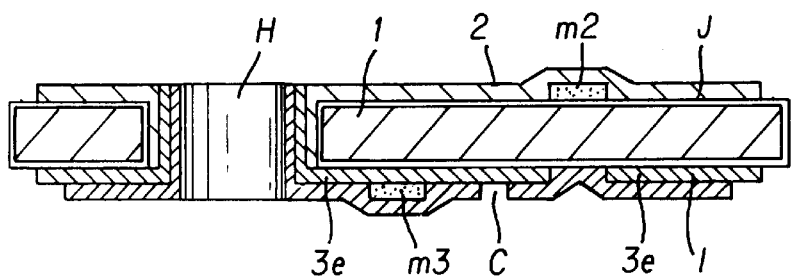
Figure 4D:
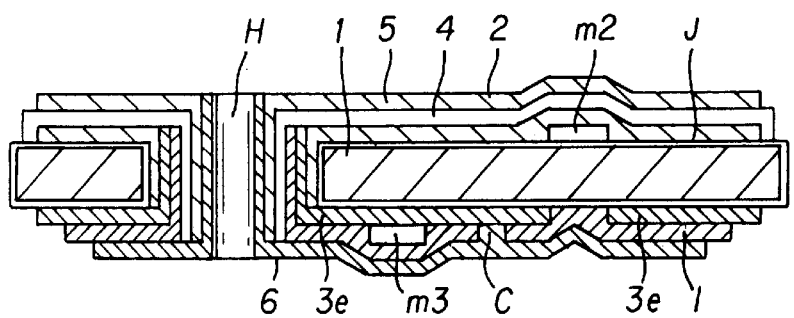
Figure 4E:
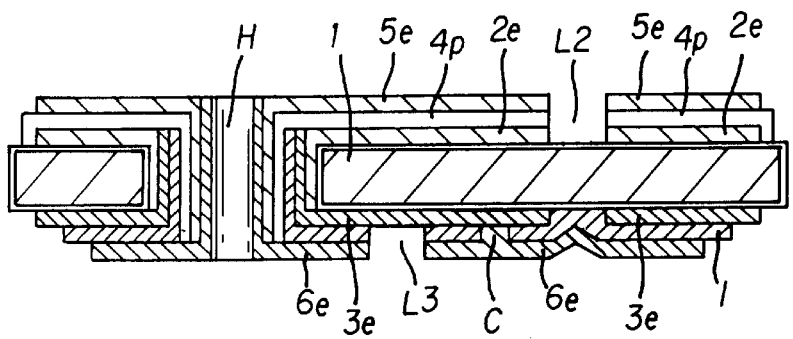

FIG. 3(a) is a plan view showing another embodiment of a photoelectric conversion apparatus of the present invention, and FIG. 3(b) is a cross-sectional view taken along line x–X of FIG. 3(a). FIGS. 4(a) through 4(e) show process steps for fabricating the photoelectric conversion apparatus of the present embodiment, wherein FIG. 4(a) shows the state in which a first connecting electrode layer has been formed, FIG. 4(b) shows the state in which an insulating layer has been formed, FIG. 4(c) shows the state in which a parting line for the insulating layer has been formed, FIG. 4(d) shows the state in which a second connecting electrode layer has been formed, and FIG. 4(e) shows the state in which unit photoelectric conversion elements and second connecting electrodes have been formed. In FIG. 3(b), "n" is suffixed to reference numerals that denote adjacent unit photoelectric conversion element and adjacent electrodes.

The photoelectric conversion apparatus of the present embodiment of FIG. 1 is fabricated according the manufacturing process having the steps of FIG. 4(a) through FIG. 4(e).

Initially, 1 mm-diameter apertures (common connection holes H) are formed using a punch, through a 0.1 mm-thickness substrate 1 made of stainless steel and having a certain electrical conductivity. Thereafter, a substrate insulating layer J having a thickness of several microns and made of aramid resin is formed on the opposite surfaces of the substrate 1, to thus give an insulating property to the surface of the substrate 1 and the inner walls of the apertures H. Then, strip-like lift-off masks m1, m2 made of polyimide resin are formed on parts of the substrate insulating layer J by screen printing. Further, a laminate of silver and zinc oxide layers is successively formed on the opposite surfaces of the substrate by sputtering, so as to form a lower electrode layer 2 and a first connecting electrode layer 3. The lower electrode layer 2 and first connecting electrode layer 3 are superposed on each other on the inner wall of each common connection hole H so that these layers 2, 3 are electrically connected with each other, as shown in FIG. 4(a).

In the next step of FIG. 4(b), the lift-off mask m1 formed on the insulating layer J on the rear surface of the substrate 1 is peeled off so that a linear part of the first connecting electrode layer 3 formed on the upper face of the mask m1 is removed, to thus form a parting line L1 that divides the first connecting electrode layer 3 into individual first connecting electrodes 3e.

In the same step of FIG. 4(b), strip-like lift-off masks m3, mc are formed on the first connecting electrode 3e by screen printing. Also, an insulating layer I made of silicon nitride is formed on the rear surface of the substrate 1 by sputtering, such that the inner wall of the common connection hole H is also covered with the insulating layer I.

In the next step of FIG. 4(c), the lift-off mask mc on the rear surface of the substrate 1 is removed along with a part of the insulating layer I formed on the upper face of the mask mc, to provide a removed portion C of the insulating layer so that the first connecting electrode 3e is exposed to the outside through the removed portion C.

The removed portion C of the insulating layer is utilized for connecting the first connecting electrode 3e with a second connecting electrode 6e to be formed in the next step. The removed portion C may be in the form of one or more hole(s) or a parting line that traverses the insulating layer.

In the next step of FIG. 4(d), a photoelectric conversion layer 4 made of a-Si is formed by plasma CVD on the front surface of the substrate 1, and an upper electrode layer 5 made of indium oxide is then formed by sputtering on the photoelectric conversion layer 4. In addition, a second connecting electrode layer 6 made of nickel is formed on the rear surface of the substrate 1. The upper electrode layer 5 and the second connecting electrode layer 6 overlap each other on the inner wall of the common connection hole H, sch that these layers 5, 6 are electrically connected to each other. Also, the second connecting electrode layer 6 and the first connecting electrode 3e are connected to each other at the removed portion C of the insulating layer.

In the following step of FIG. 4(e), the lift-off mask m3 formed on the rear surface of the substrate 1 is peeled off so as to remove a part of the second connecting electrode layer 6 located on the mask m3, and thereby form a parting line L3, so that the second connecting electrode layer 6 is divided into individual second connecting electrodes 6e. The lift-off mask m2 on the light-receiving or power-generating surface is also peeled off in a similar manner, so that parts of the lower electrode layer 2, photoelectric conversion layer 4 and upper electrode 6e located on the upper face of the mask m2 are removed to thus form a parting line L2, so that these layers 2, 4 and 5 are respectively divided into individual lower electrodes 2e, photoelectric conversion layers 4p and upper electrodes 6e. In this manner, unit photoelectric conversion elements each consisting of the lower electrode 2e, photoelectric conversion layer 4p and upper electrode 6e are formed in series connection, as shown in FIG. 4(e) and FIGS. 3(a) and 3(b).

The photoelectric conversion apparatus fabricated in the above manner according to the present invention does not suffer from area loss due to connection holes and non-power-generating regions surrounding the holes as provided in conventional photoelectric conversion apparatuses. Furthermore, the above-described method for producing the photoelectric conversion apparatus is relatively simple since it does not use laser beam machining that requires highly accurate positional control.

Third embodiment

Figure 5A:
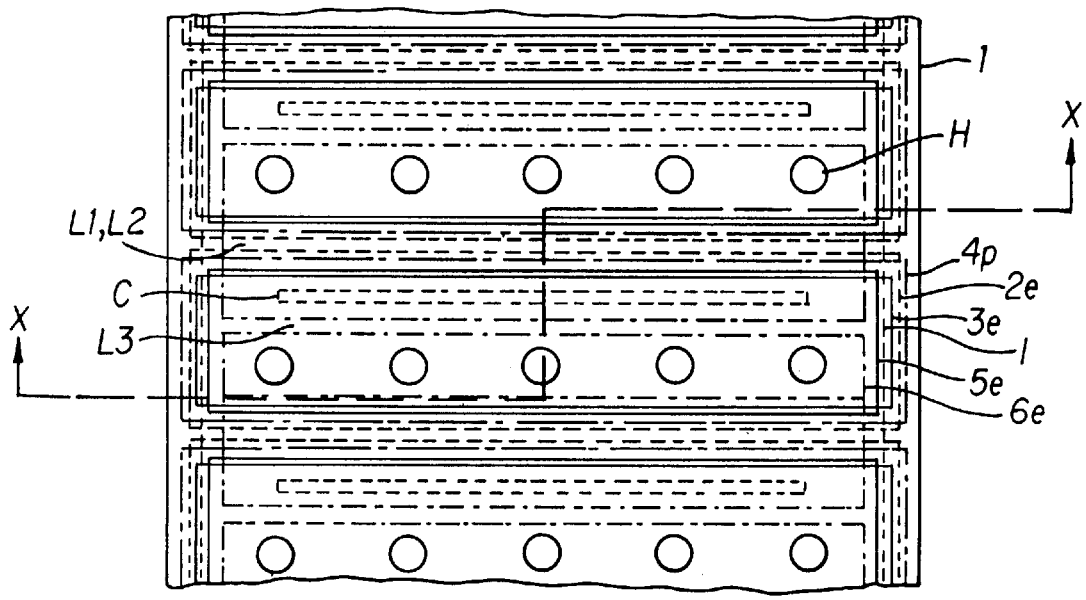
FIG. 5(a) is a plan view showing a photoelectric conversion apparatus having common connection holes, as a further preferred embodiment of the present invention.
Figure 5B:
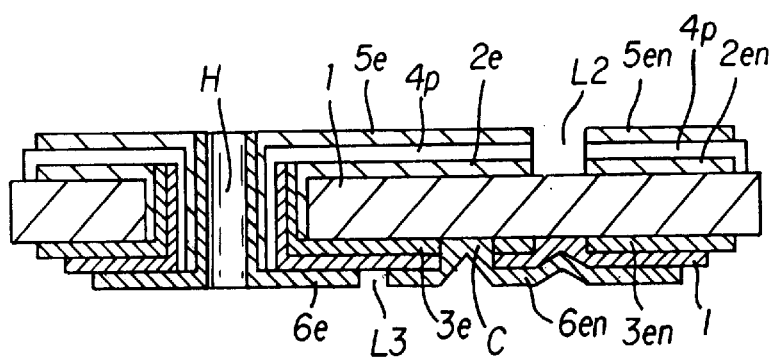
FIG. 5(b) is a cross-sectional view taken along lines x–X of FIG. 5(a)
Figure 6A:
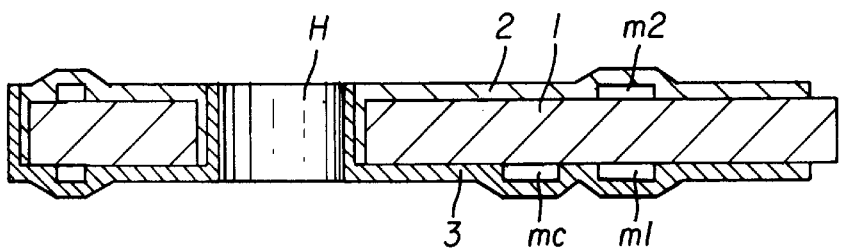
FIGS. 6(a)–6(e) are views showing respective process steps for fabricating the photoelectric conversion apparatus of the embodiment of FIGS. 5(a) and 5(b)
Figure 6B:
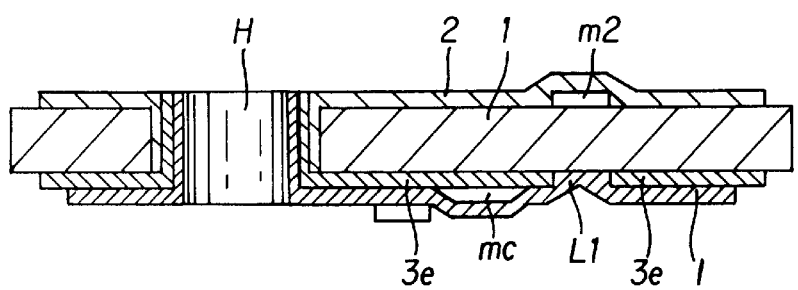
Figure 6C:
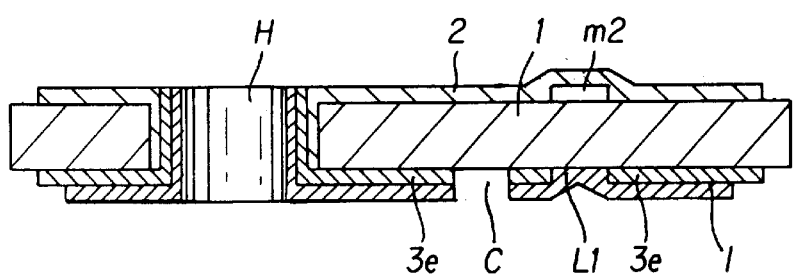
Figure 6D:
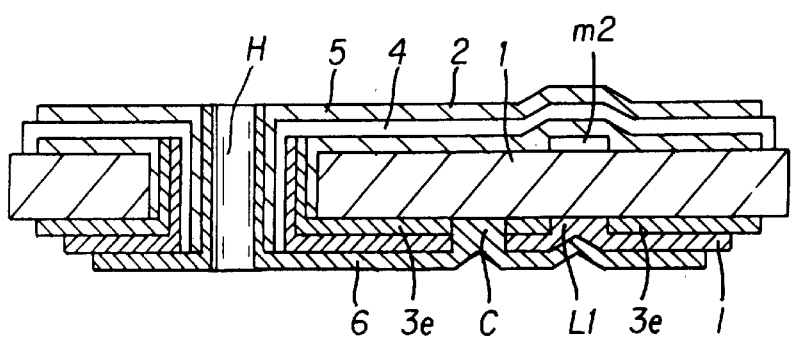
Figure 6E:
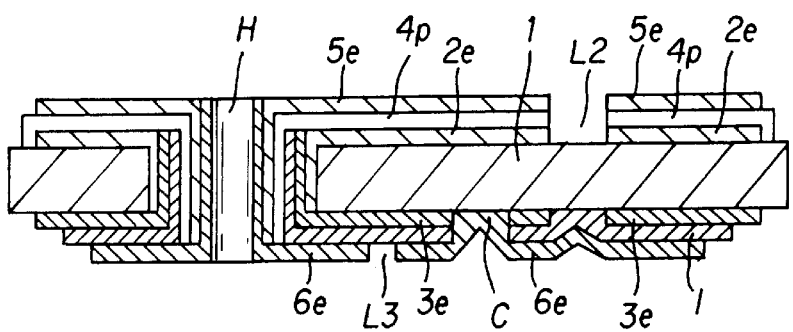
Figure 7A:
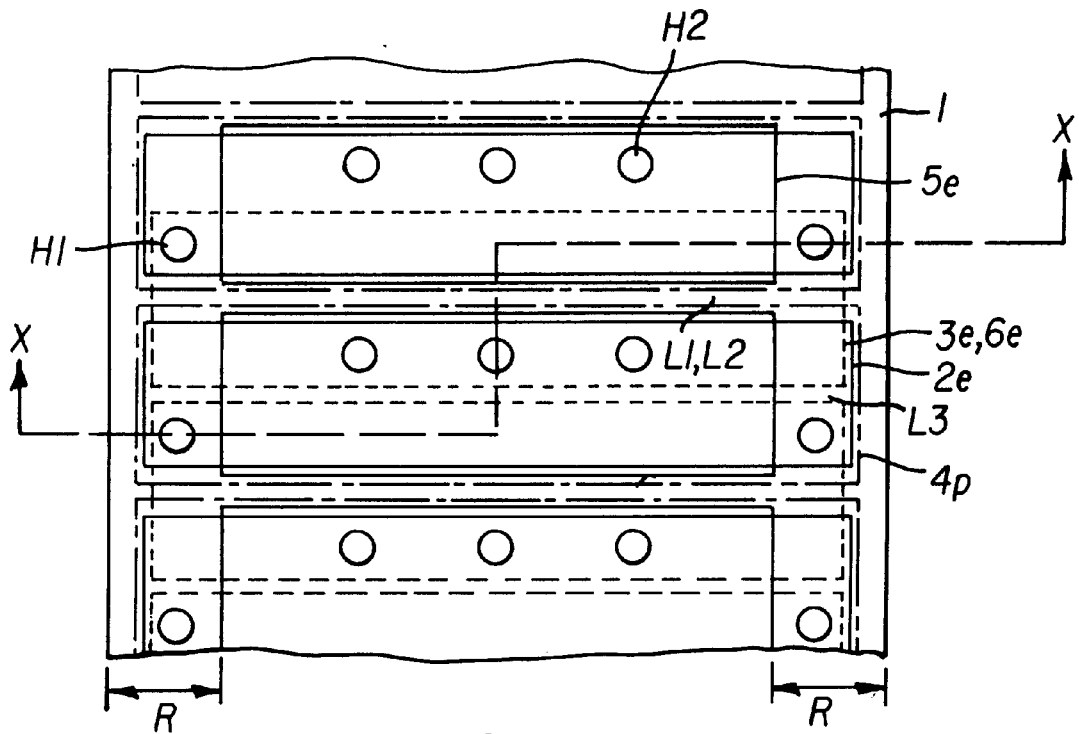
FIG. 7(a) is a plan view showing a thin-film solar cell having series-connected electrodes formed on the opposite surfaces of a substrate.
Figure 7B:
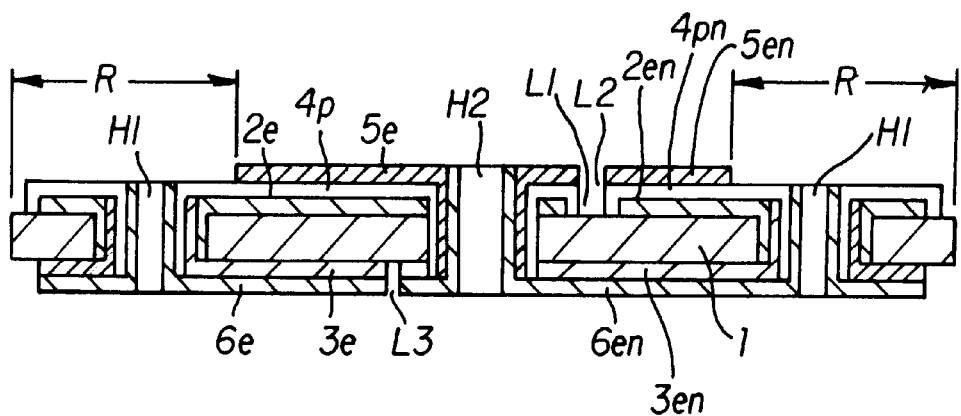
FIG. 7(b) is a cross-sectional view taken along lines x–X of FIG. 7(a).

FIG. 5(a) is a plan view showing another embodiment of a photoelectric conversion apparatus of the present invention, and FIG. 5(b) is a cross-sectional view taken along line x–X of FIG. 5(a). FIGS. 6(a) through 6(e) show process steps for fabricating the photoelectric conversion apparatus of the present embodiment, wherein FIG. 6(a) shows the state in which a first connecting electrode layer has been formed, FIG. 6(b) shows the state in which an insulating layer has been formed, FIG. 6(c) shows the state in which a connection hole has been formed through the insulating layer, FIG. 6(d) shows the state in which a second connecting electrode layer has been formed, and FIG. 6(e) shows the state in which unit photoelectric conversion elements and second connecting electrodes have been formed. In FIG. 5(b), "n" is suffixed to reference numerals that denote adjacent unit photoelectric conversion element and adjacent electrodes.

The photoelectric conversion apparatus of the embodiment of FIG. 5 is fabricated according the manufacturing process having the steps of FIG. 6(a) through FIG. 6(e).

Initially, 1 mm-diameter apertures (common connection holes H) are formed using a punch, through a 0.2 nm-thickness substrate 1 made of polyimide resin. Thereafter, strip-like lift-off masks m1, m2 and mc made of polyimide resin are formed on certain parts of the opposite surfaces of the substrate 1. Further, laminates of silver and zinc oxide layers are successively formed on the opposite surfaces of the substrate by sputtering, so as to form a lower electrode layer 2 and a first connecting electrode layer 3, as shown in FIG. 6(a).

In the next step of FIG. 6(b), the lift-off mask m1 formed on the rear surface of the substrate 1 is peeled off along with a part of the first connecting electrode layer 3 located on the upper face of the mask m1, so as to form a parting line L1 at which the first connecting electrode layer 3 is split into individual connecting electrodes 3e. Then, an insulating layer I made of trifluoroethane is formed by screen printing, such that the inner wall of each aperture H is also covered with the insulating layer I.

Subsequently, the lift-off mask mc formed on the rear surface of the substrate 1 is peeled off along with corresponding parts of the first connecting electrode 3e and insulating layer I located on the upper face of the mask mc, so that a removed portion C of the insulating layer is formed with the broken-out section of the first connecting electrode 3 being exposed to the outside, as shown in FIG. 6(c).

In the next step of FIG. 6(d), a photoelectric conversion layer 4 made of a-Si is formed by plasma CVD on the front surface of the substrate 1, and an upper electrode layer 5 made of indium oxide is then formed by sputtering on the photoelectric conversion layer 4. In addition, a second connecting electrode layer 6 made of copper is formed on the rear surface of the substrate 1, so that the spaced-apart first connecting electrodes 3e are connected by the second connecting electrode layer 6.

Thereafter, a parting line L3 is formed only through the second connecting electrode layer 6 by laser beam machining, so that the electrode layer 6 is split into individual second connecting electrodes 6e. The parting line L3 need not be aligned with a parting line of the electrodes on the front surface of the substrate, and thus the formation of the parting line L3 does not require particularly high positional accuracy in laser beam machining.

In the next step of FIG. 6(e), the lift-off mask m2 is similarly peeled off along with corresponding parts of the lower electrode layer 2, photoelectric conversion layer 4 and the upper electrode layer 5 located on the upper face of the mask m2, so as to form a parting line L2 at which the three layers 2, 4 and 5 are respectively split into individual lower electrodes 2e, photoelectric conversion layers 4p and upper electrodes 5e . In this manner, unit photoelectric conversion elements each consisting of the lower electrode, photoelectric conversion layer 4p and upper electrode 5e are formed in series connection, as shown in FIG. 6(e) and FIGS. 5(a) and 5(b).

The photoelectric conversion apparatus fabricated according to the present invention does not suffer from area loss due to connection holes and non-power-generating regions surrounding the holes as provided in conventional photoelectric conversion apparatuses. Furthermore, the above-described method for manufacturing the photoelectric conversion apparatus is relatively simple since it does not require highly accurate positional control in laser beam machining.

What is claimed is:

1. A photoelectric conversion apparatus comprising:
   a substrate at least a surface of which has an insulating property;
   a plurality of unit photoelectric conversion elements each comprising at least three layers of a lower electrode, a photoelectric conversion layer, and an upper electrode that are formed on a first surface of the substrate in this order; and
   a plurality of rear electrodes formed on a second surface of said substrate;
   wherein the lower electrode and upper electrode of each of said unit photoelectric conversion elements are connected to a corresponding one of said rear electrodes through an aperture formed through said substrate, such that the unit photoelectric conversion elements are connected in series;
   wherein each of said rear electrodes comprises a first connecting electrode and a second connecting electrode; and
   wherein a first connection part of the lower electrode of each of said unit photoelectric conversion elements which connects with the first connecting electrode of the corresponding one of the rear electrodes, and a second connection part of the upper electrode of each of said photoelectric conversion elements which connects with the second connecting electrode of the corresponding rear electrode are both located on an inner wall of said aperture formed through the substrate.

2. A photoelectric conversion apparatus according to claim 1, further comprising an insulating layer that is interposed between said first connection part of the lower electrode with the first connecting electrode and said second connecting part of the upper electrode with the second connecting electrode, such that both of the first and second connection parts are insulated from each other by the insulating layer.

3. A photoelectric conversion apparatus according to claim 1 or claim 2, further comprising an insulating layer that is interposed between the first connecting electrode and the second connecting electrode corresponding to each of said unit photoelectric conversion elements, such that the first and second connecting electrodes are insulated from each other by the insulating layer.

4. A photoelectric conversion apparatus according to claim 3, wherein said insulating layer, which is interposed between the first connecting electrode and the second electrode, includes a removed portion formed therethough, and the first connecting electrode corresponding to each of said unit photoelectric conversion elements is connected with the second connecting electrode corresponding to an adjacent one of the unit photoelectric conversion elements within said removed portion of said insulating layer.

5. A photoelectric conversion apparatus according to claim 2, wherein said insulating layer comprises one of silicon oxide and silicon nitride.

6. A photoelectric conversion apparatus according to claim 3, wherein said insulating layer, which is interposed between the first connecting electrode and the second electrode, comprises one of silicon oxide and silicon nitride.

7. A photoelectric conversion apparatus according to claim 2, wherein said insulating layer comprises heat-resistant resin selected from the group consisting of polyimide, aramid and tetrafluoroethylene.

8. A photoelectric conversion apparatus according to claim 3, wherein said insulating layer, which is interposed between the first connecting electrode and the second electrode comprises heat-resistant resin selected from the group consisting of polyimide, aramid and tetrafluoroethylene.

9. A photoelectric conversion apparatus according to claim 1, wherein said substrate comprises a conductive substrate and a substrate insulating layer that covers a surface of the conductive substrate, and wherein at least the inner wall of said aperture is covered by the substrate insulating layer, such that said first and second connection parts are insulated from the substrate.

10. A photoelectric conversion apparatus according to claim 9, wherein said insulating layer comprises one of silicon oxide and silicon nitride.

11. A photoelectric conversion apparatus according to claim 9, wherein said insulating layer comprises heat-resistant resin selected from the group consisting of polyimide, aramid and tetrafluoroethylene.

12. A method for manufacturing a photoelectric conversion apparatus, comprising the steps of:

forming a plurality of unit photoelectric conversion elements on a first surface of a substrate having an insulating surface, each of said unit photoelectric conversion elements comprising at least a lower electrode, a photoelectric conversion layer, and an upper electrode that are formed on the first surface of the substrate in this order; and forming a plurality of rear electrodes on a second surface of said substrate, such that the lower electrode and upper electrode of each of said unit photoelectric conversion elements are connected to a corresponding one of the rear electrodes through an aperture formed through said substrate so that the unit photoelectric conversion elements are connected in series, each of said rear electrodes comprising a first connecting electrode and a second connecting electrode;

wherein the lower electrode of each of said unit photoelectric conversion elements is connected with the first connecting electrode of the corresponding one of the rear electrodes on an inner wall of said aperture, while the upper electrode of said each unit photoelectric conversion element is connected with the second connecting electrode of the corresponding rear electrode on the inner wall of the same aperture formed through the substrate; and wherein a single film or a laminated film comprising at least one of the lower electrode, photoelectric conversion layer, upper electrode, first connecting electrode, and the second connecting electrode is partially removed by forming a lift-off mask having a shape to be removed, then forming the single film or laminated film to be partially removed over the lift-off mask, and then peeling off the lift-off mask while removing a part of the single film or laminated film that is located on the lift-off mask.

13. A method for manufacturing a photoelectric conversion apparatus according to claim 12, further comprising the steps of:

forming an insulating layer that is interposed between the first connecting electrode and the second connecting electrode corresponding to each of said unit photoelectric conversion elements, such that the first and second connecting electrodes are insulated from each other by the insulating layer;

wherein a single film or a laminated film comprising at least one of the lower electrode, photoelectric conversion layer, upper electrode, first connecting electrode, second connecting electrode and the insulating layer is partially removed by forming a lift-off mask having a shape to be removed, then forming the single film or laminated film to be partially removed over the lift-off mask, and then peeling off the lift-off mask while removing a part of the single film or laminated film that is located on the lift-off mask.

14. A method for manufacturing a photoelectric conversion apparatus according to claim 12 or 13, wherein said lift-off mask comprises polyimide resin.

15. A method for manufacturing a photoelectric conversion apparatus according to claim 12 or 13, wherein said lift-off mask is formed by screen printing.

16. A method for manufacturing a photoelectric conversion apparatus according to claim 13, wherein the first connecting electrode and the second connecting electrode with the insulating layer interposed therebetween are electrically connected to each other by forming an opening through the insulating layer, and melting the first and second connecting electrode layers so as to fill the opening.

* * * * *